US011645184B2

(12) United States Patent
Carey (10) Patent No.: US 11,645,184 B2
(45) Date of Patent: May 9, 2023

(54) SYSTEMS AND METHODS FOR PREDICTING HARD DRIVE PERFORMANCE (71) Applicant: Dell Products L.P., Hopkinton, MA (US)

(72) Inventor: Daniel J. Carey, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 188 days.

(21) Appl. No.: 16/926,612

(22) Filed: Jul. 10, 2020

(65) Prior Publication Data

US 2022/0012153 A1 Jan. 13, 2022

(51) Int. Cl.
G06F 11/34 (2006.01)
G06F 30/20 (2020.01)
G06F 11/30 (2006.01)
G11B 33/02 (2006.01)

(52) U.S. Cl.
CPC ...... *G06F 11/3409* (2013.01); *G06F 11/3034* (2013.01); *G06F 30/20* (2020.01); *G11B 33/022* (2013.01)

(58) Field of Classification Search
CPC .. G06F 11/3409; G06F 11/3034; G06F 30/20; G06F 2201/81; G06F 11/3058; G06F 11/3089; G11B 33/022
See application file for complete search history.

(56) References Cited

U.S. PATENT DOCUMENTS

| | | | |
|---|---|---|---|
| 8,976,472 B1* | 3/2015 | Theimer | G11B 19/042 360/39 |
| 2009/0027846 A1* | 1/2009 | Armendariz | G11B 5/5565 361/679.33 |
| 2009/0067080 A1* | 3/2009 | Gross | G11B 33/08 360/71 |
| 2010/0036621 A1* | 2/2010 | Bougaev | G01R 9/04 702/56 |
| 2010/0290144 A1* | 11/2010 | Bougaev | G11B 19/048 |
| 2012/0243116 A1 | 9/2012 | Makino | |
| 2018/0089258 A1 | 3/2018 | Bhattacharjee et al. | |
| 2020/0050586 A1 | 2/2020 | Pal et al. | |

OTHER PUBLICATIONS

Mohammad Shahrad et al., "Acoustic Denial of Service Attacks o HDDs", Princeton University, Dec. 21, 2017 (8 pages).

* cited by examiner

*Primary Examiner* — Mohammad K Islam
(74) *Attorney, Agent, or Firm* — Chamberlain, Hrdlicka, White, Williams & Aughtry (57) ABSTRACT A method for designing an enclosure by predicting hard drive disk (HDD) performance in an experimental enclosure, where the enclosure is a modified version of the experimental enclosure. The method includes obtaining, by an HDD performance data generator, an experimental enclosure vibration dataset from a vibration measurement apparatus, obtaining an ideal HDD vibration threshold; making a first comparison between the experimental enclosure vibration dataset and the ideal HDD vibration threshold, calculating, based on the first comparison, an experimental enclosure HDD performance dataset, making a first determination that the experimental enclosure HDD performance dataset exceeds an acceptable threshold, and performing a design action on the experimental enclosure based on the first determination to generate a design of the enclosure.

20 Claims, 8 Drawing Sheets

SYSTEMS AND METHODS FOR PREDICTING HARD DRIVE PERFORMANCE

BACKGROUND

Devices and/or components of devices are often capable of performing certain functionalities that other devices and/or components are not configured to perform and/or are not capable of performing. In such scenarios, it may be desirable to adapt one or more systems to enhance the functionalities of devices and/or components that cannot perform the one or more functionalities.

SUMMARY

In general, in one aspect, embodiments relate to a method for predicting hard drive disk (HDD) performance in an experimental enclosure, that includes obtaining, by an HDD performance data generator, an experimental enclosure vibration dataset from a vibration measurement apparatus; obtaining an ideal HDD vibration threshold; making a first comparison between the experimental enclosure vibration dataset and the ideal HDD vibration threshold; calculating, based on the first comparison, an experimental enclosure HDD performance dataset; making a first determination that the experimental enclosure HDD performance dataset exceeds an acceptable threshold; and performing a design action on the experimental enclosure based on the first determination to generate a design of an enclosure, where the enclosure is a modified version of the experimental enclosure.

In general, in one aspect, embodiments relate to a non-transitory computer readable medium that includes instructions which, when executed by a computer processor, enables the computer processor to perform a method for predicting hard drive disk (HDD) performance in an experimental enclosure, that includes obtaining, by an HDD performance data generator, an experimental enclosure vibration dataset from a vibration measurement apparatus; obtaining an ideal HDD vibration threshold; making a first comparison between the experimental enclosure vibration dataset and the ideal HDD vibration threshold; calculating, based on the first comparison, an experimental enclosure HDD performance dataset; making a first determination that the experimental enclosure HDD performance dataset exceeds an acceptable threshold; and performing a design action on the experimental enclosure based on the first determination to generate a design of an enclosure, where the enclosure is a modified version of the experimental enclosure.

In general, in one aspect, embodiments relate to an analysis system, that includes a processor; memory that includes instructions, which when executed by the processor, cause the processor to perform a method, the method that includes obtaining an experimental enclosure vibration dataset from a vibration measurement apparatus; obtaining an ideal HDD vibration threshold; making a first comparison between the experimental enclosure vibration dataset and the ideal HDD vibration threshold; calculating, based on the first comparison, an experimental enclosure HDD performance dataset; making a first determination that the experimental enclosure HDD performance dataset exceeds an acceptable threshold; and performing a design action on the experimental enclosure based on the first determination to generate a design of an enclosure, where the enclosure is a modified version of the experimental enclosure.

Other aspects of the invention will be apparent from the following description and the appended claims.

DETAILED DESCRIPTION

In general, embodiments of the invention relate to systems and methods for calculating an estimated hard disk drive (HDD) performance dataset for an experimental enclosure. In one or more embodiments of the invention, an enclosure (e.g., an individual server unit (e.g., a 1 U, 2 U, etc. unit), a server rack, an HDD case, etc.) that includes one or more HDDs may experience vibration from one or more sources (e.g., fans, other HDDs, external impacts against the enclosure, any moving object, etc.). Further, HDDs may be sensitive to vibrations such that the HDD may misread and/or miswrite data while experiencing vibration. Specifically, in one or more embodiments of the invention, one or more read/write head(s) of an HDD may be moved into an unwanted position due to vibrations transmitted through the enclosure. And, as a result, one or more read/write head(s) may be unable to read data from the HDD platter (or fail to write data to the HDD platter). In such circumstances, the HDD may be configured to automatically detect that the desired operation was unsuccessful and reattempt the original read/write action.

Despite the ability of an HDD to automatically correct errors, there is still a reduction in performance of the HDD as time and energy are consumed re-attempting the read/write operation that initially failed. Therefore, it may be desirable to reduce the vibration experienced by the HDD to improve overall performance. In one or more embodiments of the invention, HDD errors caused by vibrations may be measured by their effect on the input-output operations per second (IOPS) of the HDD. For example, an HDD under ideal conditions may be able to performs 100 IOPS. However, when experiencing vibration, that same HDD may only successfully perform 75 IOPS, from which it may be concluded that the vibration is causing a 25% reduction in IOPS performance of the HDD.

Further, in one or more embodiments of the invention, HDDs may be more prone to IOPS misses within certain frequency ranges. As a non-limiting example, vibrations of large amplitude at a high frequency may have minimal effect on IOPS performance, whereas vibrations of comparatively moderate amplitude at lower frequencies may have a significant effect on IOPS performance. Accordingly, an HDD vibration threshold dataset may be generated for a given HDD that shows acceptable vibration amplitudes at various vibration frequencies.

In one or more embodiments of the invention, the natural frequencies of the enclosure may resonate with one or more causes of the vibration and exacerbate TOPS misses. To prevent such circumstances, a complete prototype model enclosure may be fabricated and then tested using a vibration measurement apparatus to gather an enclosure vibration dataset. Specifically, vibration sensors may be placed in the enclosure where one or more HDD(s) would be installed. Sources of vibration may be activated (e.g., fans) and the vibration measured by one or more vibrations sensor(s) is recorded.

Once gathered, the enclosure vibration dataset may be compared with one or more HDD vibration threshold dataset(s) to determine the likely IOPS performance of the HDD. However, constructing an entire enclosure for vibration testing may be costly and time consuming. Further, if considerable vibrations are measured, significant redesign of the enclosure may be required. Therefore, in one or more embodiments of the invention, it may be desirable to construct only part of an experimental enclosure—which may be done more quickly and at lower cost than building a complete prototype. Then, a vibration measurement apparatus may be used for the partially-constructed experimental enclosure to obtain an experimental enclosure vibration dataset.

However, in one or more embodiments of the invention, an additional problem may arise that existing HDD vibration thresholds (measured and/or obtained from the HDD manufacturer) may vary greatly from each other. Further, in one or more embodiments of the invention, the experimental enclosure vibration data may be different than enclosure vibration data gathered from a fully-constructed prototype. Accordingly, it may be desirable to use an idealized HDD vibration threshold dataset that is broadly representative of two or more HDD vibration threshold datasets. Then, the idealized HDD vibration threshold dataset may be compared with the experimental enclosure vibration dataset in order to determine if a redesign of the experimental enclosure is necessary—without ever constructing a complete prototype.

Specific embodiments will now be described with reference to the accompanying figures. In the following description, numerous details are set forth as examples of the invention. One of ordinary skill in the art, having the benefit of this detailed description, would appreciate that one or more embodiments of the present invention may be practiced without these specific details and that numerous variations or modifications may be possible without departing from the scope of the invention. Certain details known to those of ordinary skill in the art may be omitted to avoid obscuring the description.

In the following description of the figures, any component described with regard to a figure, in various embodiments of the invention, may be equivalent to one or more like-named components shown and/or described with regard to any other figure. For brevity, descriptions of these components may not be repeated with regard to each figure. Thus, each and every embodiment of the components of each figure is incorporated by reference and assumed to be optionally present within every other figure having one or more like-named components. Additionally, in accordance with various embodiments of the invention, any description of any component of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the term 'operatively connected', or 'operative connection', means that there exists between elements/components/devices a direct or indirect connection that allows the elements to interact with one another in some way (e.g., via the exchange of information). For example, the phrase 'operatively connected' may refer to any direct (e.g., wired connection or wireless connection directly between two devices) or indirect (e.g., wired and/or wireless connections between any number of devices connecting the operatively connected devices) connection.

Figure 1A:
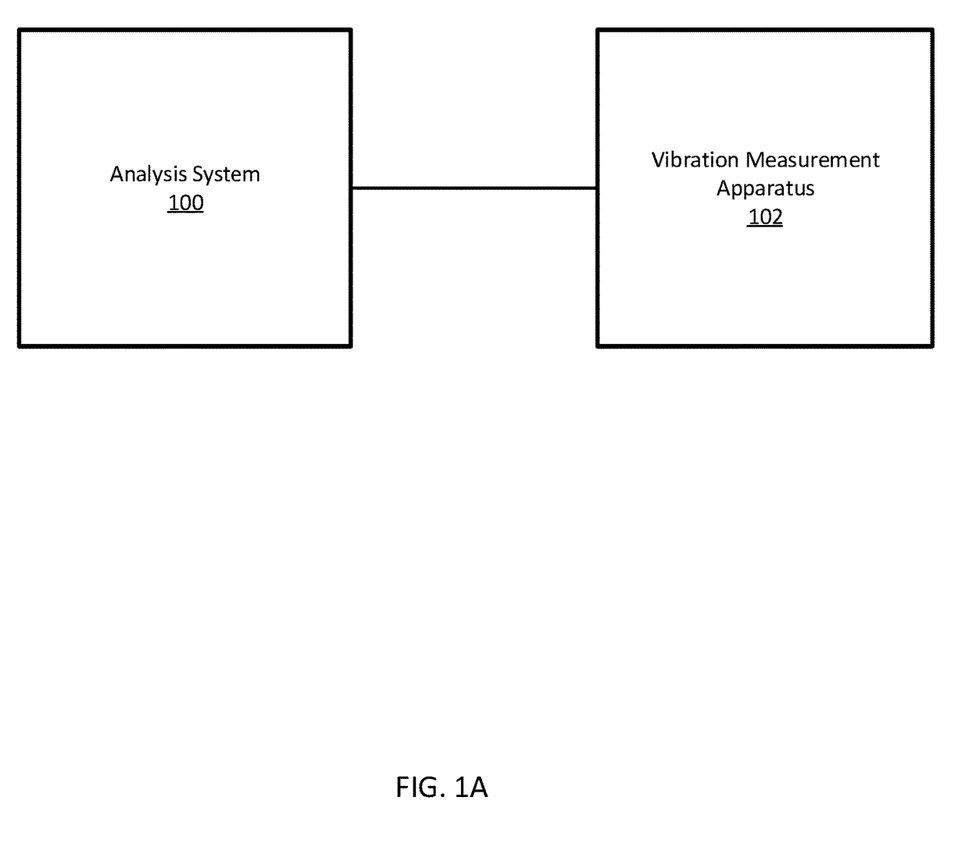
FIG. 1A shows a diagram of a system, in accordance with one or more embodiments of the invention.

FIG. 1A shows a diagram of a system, in accordance with one or more embodiments of the invention. The system may include an analysis system (e.g., analysis system (100)) and a vibration measurement apparatus (e.g., vibration measurement apparatus (102)). Each of these components is described below.

In one or more embodiments of the invention, an analysis system (e.g., analysis system (100)) is a computing device used to maintain data (e.g., one or more "dataset(s)"), process data, and/or perform one or more processes to calculate new data using the maintained datasets. In one or more embodiments of the invention, analysis system (100) is a computing device that includes one or more processor(s) (not shown), memory (not shown), and persistent storage (not shown). The persistent storage (and/or memory) may store computer instructions (e.g., computer code) which, when executed by the processor(s) of the computing device, cause the computing device to issue one or more requests and to receive one or more responses. Non-limiting examples of a computing device include a mobile phone, tablet computer, laptop computer, desktop computer, server, distributed computing system, or cloud resource. Additional details regarding the analysis system (100) may be found in the discussion of FIG. 1B.

In one or more embodiments of the invention, a vibration measurement apparatus (e.g., vibration measurement apparatus (102)) is a combination of hardware devices used to measure the vibration of an enclosure. Additional details regarding the vibration measurement apparatus (102) may be found in the discussion of FIG. 1C.

While FIG. 1A shows a specific configuration of a system, other configurations may be used without departing from the scope of the invention. Accordingly, embodiments disclosed herein should not be limited to the configuration of devices and/or components shown in FIG. 1A.

Figure 1B:
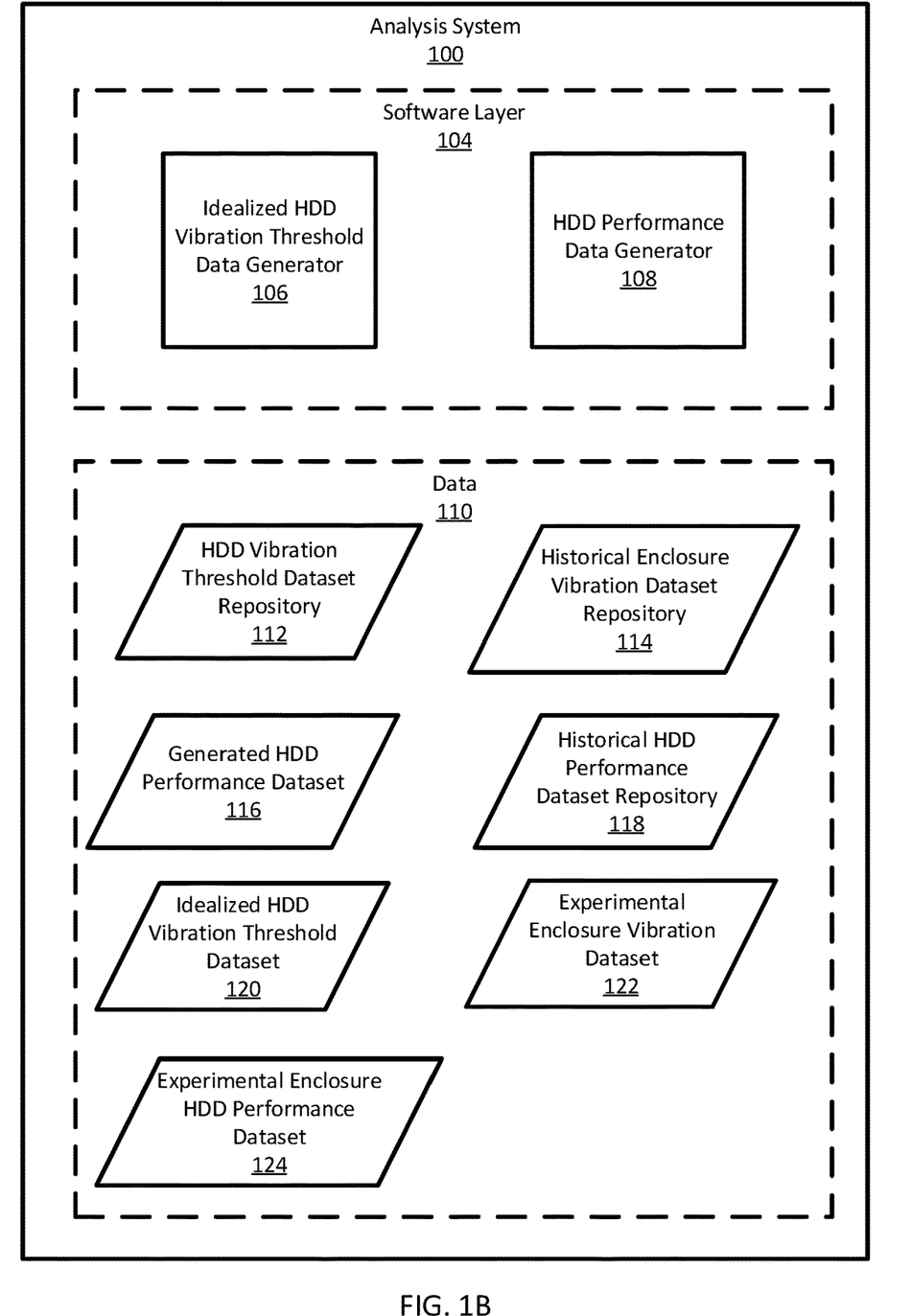
FIG. 1B shows a diagram of an analysis system, in accordance with one or more embodiments of the invention.

FIG. 1B shows a diagram of an analysis system (e.g., analysis system (100)), in accordance with one or more embodiments of the invention. Further, the analysis system may include a software layer (e.g., software layer (104)) and data (e.g., data (110)), each described below.

In one or more embodiments of the invention, software layer (e.g., software layer (104)) is an abstract virtual environment in which software executes (i.e., initiates and/or performs operations using hardware components of the analysis system (100) (not shown), etc.). That is, in one or more embodiments, although analysis system (100) may be a physical device that includes one or more hardware components, the logical operations performed by the hardware components of analysis system (100) may be conceptually identified as distinct entities (e.g., software instances) and grouped into a broader superset (i.e., software layer (104)). In one or more embodiments, software layer (104) includes an idealized HDD data generator (e.g., idealized HDD vibration threshold data generator (106)) and an HDD performance dataset generator (e.g., HDD performance dataset generator (108)). Each of these components is described below.

In one or more embodiments of the invention, an idealized HDD vibration threshold data generator (e.g., idealized HDD vibration threshold data generator (106)) is software (e.g., a "program") that is configured to execute one or more processes utilizing one or more available data (110) to generate idealized HDD vibration threshold dataset (120). The idealized HDD vibration threshold data generator (106), when executed by a processor(s) in the analysis system, may perform some or all of the method(s) disclosed in FIG. 3 and the descriptions of those figures herein.

In one or more embodiments of the invention, an HDD performance dataset generator (e.g., HDD performance dataset generator (108)) is software (e.g., a "program") that is configured to execute one or more processes utilizing one or more available data (110) to generate generated HDD performance dataset (116), historical HDD performance dataset repository (118), and/or experimental enclosure HDD performance dataset (124). The HDD performance dataset generator (108) may perform some or all of the method(s) disclosed in FIGS. 4-6 and the descriptions of those figures herein.

In one or more embodiments of the invention, data (e.g., data (110)) is digital information stored on one or more storage devices (not shown) that may be read into memory and/cache (not shown) and processed by one or more hardware components (not shown) of the analysis system (100) and used by one or more software layer (104) programs (e.g., 106, 108). In one or more embodiments of the invention, data includes an HDD vibration threshold dataset repository (e.g., HDD vibration threshold dataset repository (112)), a historical enclosure vibration dataset repository (e.g., historical enclosure vibration dataset repository (114)), generated HDD performance dataset (e.g., generated HDD performance dataset (116)), a historical HDD performance dataset repository (e.g., historical HDD performance dataset repository (118)), idealized HDD vibration threshold dataset (e.g., idealized HDD vibration threshold dataset (120)), experimental enclosure vibration dataset (e.g., experimental enclosure vibration dataset (122)), and experimental enclosure HDD performance dataset (e.g., experimental enclosure HDD performance dataset (124)).

In one or more embodiments of the invention, an HDD vibration threshold dataset repository (e.g., HDD vibration threshold dataset repository (112)) is a collection of one or more individual HDD vibration threshold dataset(s). Additional details regarding HDD vibration threshold datasets may be found in the discussion of FIG. 1D.

In one or more embodiments of the invention, an historical enclosure vibration dataset repository (e.g., historical enclosure vibration dataset repository (114)) is a collection of one or more enclosure vibration dataset(s). Specifically, in one embodiment of the invention, the historical enclosure vibration dataset repository (114) stores previously measured enclosure vibration datasets from previous fully-constructed enclosures. In one or more embodiments of the invention, an enclosure is a full-constructed enclosure. Additional details regarding enclosure vibration datasets may be found in the discussion of FIG. 1D.

In one or more embodiments of the invention, a generated HDD performance dataset (e.g., generated HDD performance dataset (116)) is an HDD performance dataset generated by the idealized HDD vibration threshold data generator when generating the idealized HDD vibration threshold. Additional details regarding HDD performance datasets may be found in the discussion of FIG. 1D and FIG. 4.

In one or more embodiments of the invention, a historical HDD performance dataset repository (e.g., historical HDD performance dataset repository (118)) is a collection of one or more HDD performance dataset(s). Specifically, in one embodiment of the invention, the historical HDD performance dataset repository (118) stores previously measured HDD performance dataset from previous comparison of HDD vibration threshold datasets to enclosure vibration datasets. Additional details regarding HDD performance datasets may be found in the discussion of FIG. 1D.

In one or more embodiments of the invention, idealized HDD vibration threshold dataset (e.g., idealized HDD vibration threshold dataset (120)) is a vibration threshold dataset generated by the idealized HDD vibration threshold data generator. Additional details regarding HDD vibration threshold datasets may be found in the discussion of FIG. 1D and FIG. 3.

In one or more embodiments of the invention, an experimental enclosure vibration dataset (e.g., experimental enclosure vibration dataset (122)) is an enclosure vibration dataset measured and recorded from a vibration measurement apparatus for a partially-constructed experimental enclosure. In one or more embodiments of the invention, an experimental enclosure is a partially-constructed enclosure. Additional details regarding enclosure vibration datasets may be found in the discussion of FIG. 1D.

In one or more embodiments of the invention, an experimental enclosure HDD performance dataset (e.g., experimental enclosure HDD performance dataset (124)) is an HDD performance dataset generated by the HDD performance data generator using the experimental enclosure vibration dataset (122) and the idealized HDD vibration threshold dataset (120). Additional details regarding HDD performance datasets may be found in the discussion of FIG. 1D and FIG. 5.

While FIG. 1B shows a specific configuration of an analysis system, other configurations may be used without departing from the scope of the invention. Accordingly, embodiments disclosed herein should not be limited to the configuration of devices and/or components shown in FIG. 1B. For example, the functionality of the Software Layer may be implemented using a field programmable gate array (FPGA), a complex programmable logic device (CPLD), application-specific integrated circuit (ASIC), a system on chip (SoC) or any combinations thereof, etc.

Figure 1C:
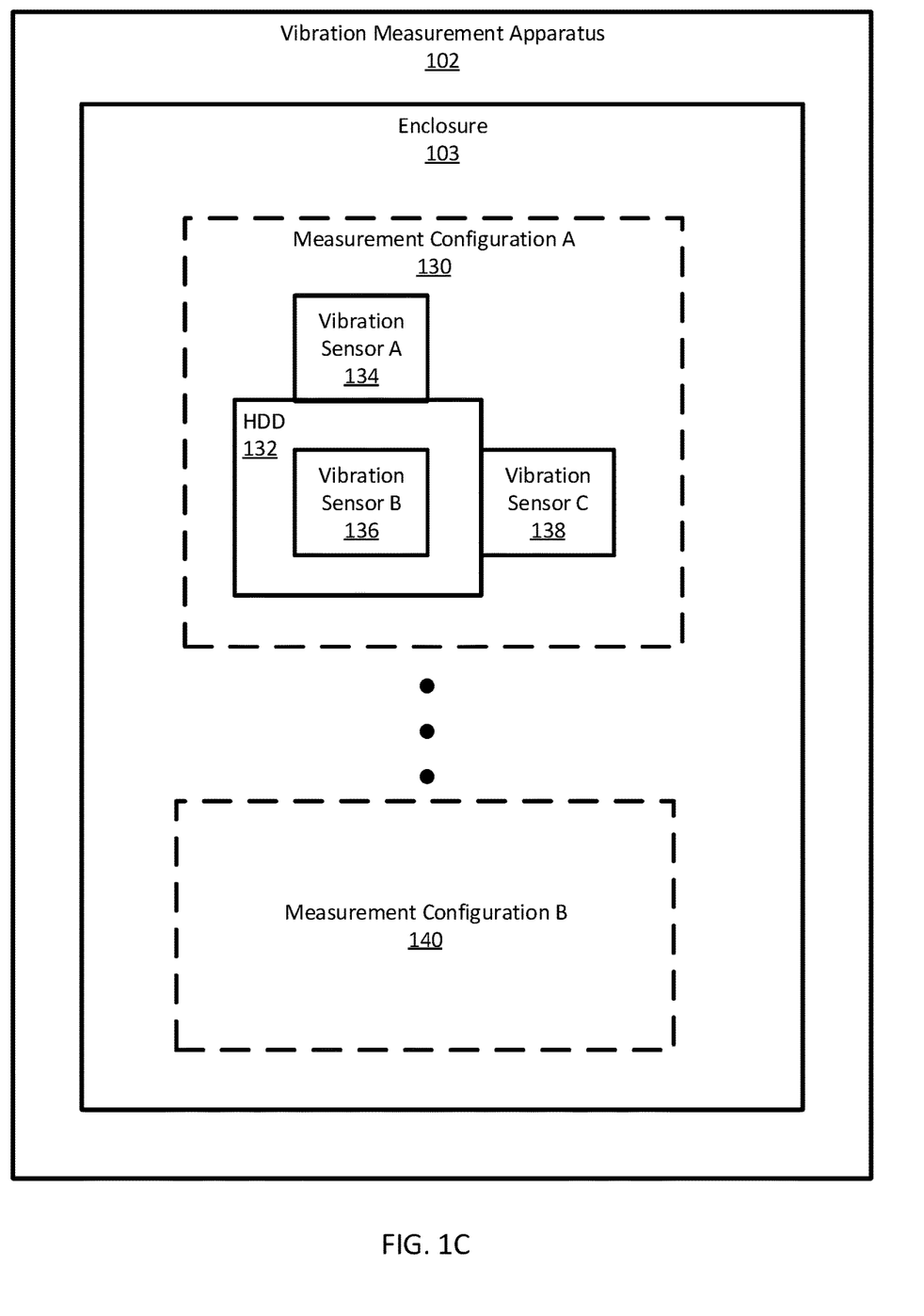
FIG. 1C shows a diagram of a vibration measurement apparatus, in accordance with one or more embodiments of the invention.

FIG. 1C shows a diagram of a vibration measurement apparatus (e.g., vibration measurement apparatus (102)), in accordance with one or more embodiments of the invention. The vibration measurement apparatus (102) may include an enclosure (e.g., enclosure (103)) that further includes one or more measurement configuration(s) (e.g., measurement configuration A (130), measurement configuration B (140), etc.). Each of these components is described below.

In one or more embodiments of the invention, an enclosure (e.g., enclosure (103)) is a housing for one or more hardware component(s) that, when fully constructed, includes one or more HDD(s). In one or more embodiments of the invention, one or more component(s) of an enclosure (103) causes vibration that is transmitted throughout the enclosure. Non-limiting examples of enclosure include an individual server unit (e.g., a 1 U, 2 U, etc. unit), a server rack, and an HDD case.

In one or more embodiments of the invention, a measurement configuration (e.g., measurement configuration A (130), measurement configuration B (140)) is a collection of one or more vibration sensor(s) (134, 136, 138) located on a HDD (132) or located on the enclosure (103) near where an HDD (132) may be installed. Further, an HDD may not be present within a measurement configuration (130, 140) if the enclosure (103) is a partially-constructed experimental enclosure that only includes bare structural elements.

In one or more embodiments of the invention, an HDD is a magnetic storage device that encodes data onto one or more platters (not shown) inside the HDD. Data is written onto and read from one or more platter(s) using a read/write head(s). One of ordinary skill in the art, having the benefit of this detailed description, would appreciate the basic construction and operation of an HDD.

In one or more embodiments of the invention, a vibration sensor (e.g., 134, 136, 138) is a hardware device used to measure vibration and output the measurements in some readable form. As a non-limiting example, a vibration sensor may output a varying electrical (e.g., via change in resistance) to a computing device (not shown) of the vibration measurement apparatus (102) so that such measurements may be saved and stored. In one or more embodiments of the invention, a vibration sensor (134, 136, 138) may be an accelerometer that is configured to measure and output changes in acceleration experienced by the vibration sensor (134, 136, 138).

While FIG. 1C shows a specific configuration of a vibration measurement apparatus, other configurations may be used without departing from the scope of the invention. Accordingly, embodiments disclosed herein should not be limited to the configuration of devices and/or components shown in FIG. 1C.

Figure 1D:
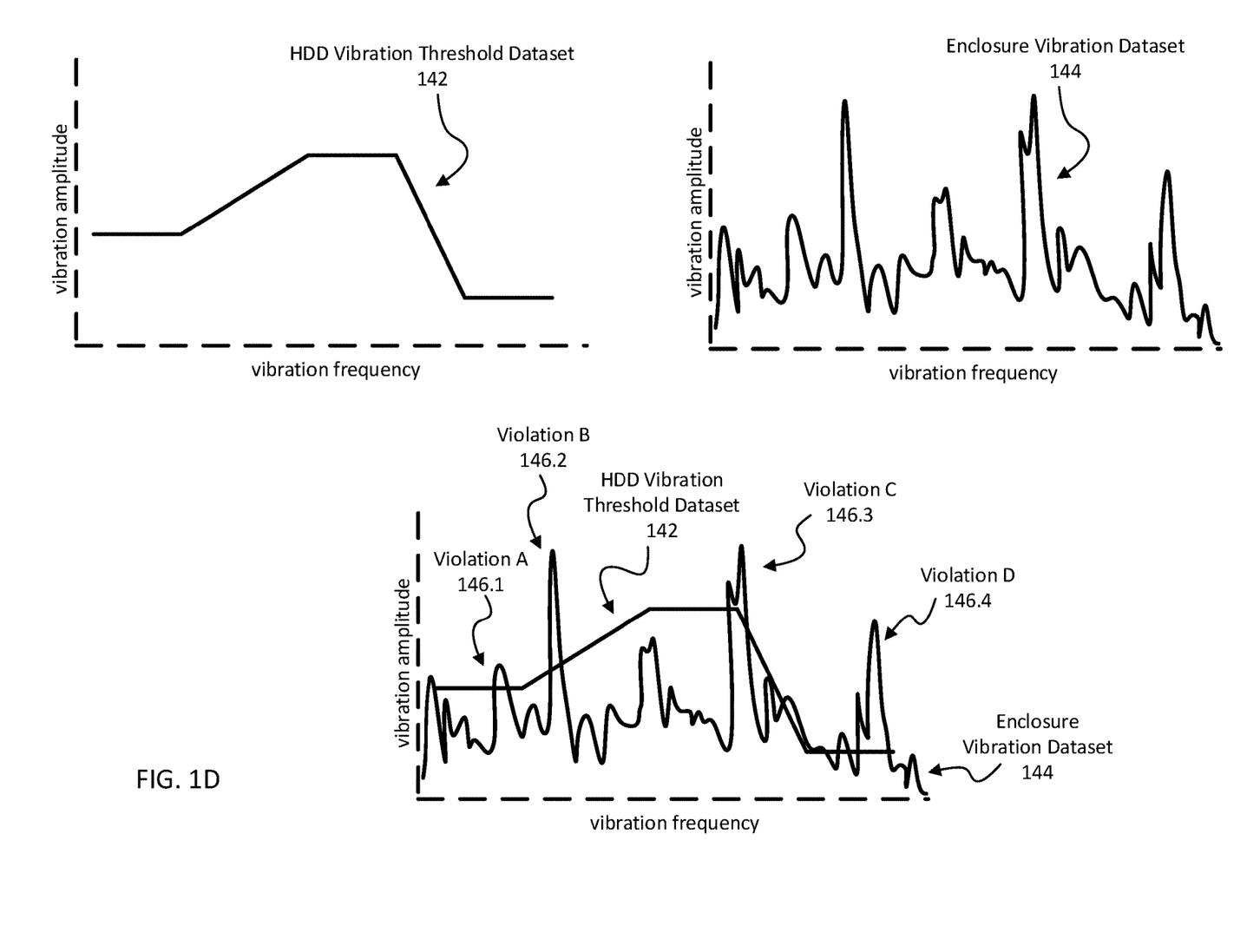
FIG. 1D shows an example of hard disk drive (HDD) vibration threshold dataset and enclosure vibration dataset.

FIG. 1D shows an example of HDD vibration a threshold dataset (e.g., HDD vibration threshold dataset (142)) and an enclosure vibration dataset (e.g., enclosure vibration dataset (144)). The following use case is for explanatory purposes only and not intended to limit the scope to this embodiment.

In one or more embodiments of the invention, an HDD vibration threshold dataset (e.g., HDD vibration threshold dataset (142)) may be used to calculate and/or determine an acceptable vibration amplitude at a given vibration frequency for an HDD. An HDD vibration threshold dataset (142) may be stored and represented (e.g., plotted) as a series of discrete datapoints associating vibration frequencies with respective vibration amplitudes.

As non-limiting example, an HDD may be able to safely operate within a threshold of 0.1 Power Spectral Density (PSD) between 0 Hz and 250 Hz, followed by a linear increasing threshold of 0.1 PSD to 1.0 PSD between 250 Hz and 1,000 Hz, etc. Accordingly, if the HDD were to experience vibrations of 0.05 PSD at 150 Hz, the HDD may operate with acceptable IOPs performance. However, if the HDD were to experience vibrations of 0.2 PSD at 150 Hz, the HDD may experience a reduction in IOPs performance.

One of ordinary skill in the art, having the benefit of this detailed description, would appreciate that the one or more segments of the HDD vibration threshold dataset (142) may be stored using any standard method of algebraic expression or in a series of discrete calculated and/or measured data points. Further, one of ordinary skill in the art, having the benefit of this detailed description, would appreciate that any suitable units may be used for the HDD vibration threshold dataset (142). For example, vibration amplitude may be measured by acceleration and any dimensionally acceptable units thereof (e.g., G, $m/s^2$, $ft/s^2$, etc.).

In one or more embodiments of the invention, each HDD may have six unique HDD vibration threshold datasets. Specifically, each HDD may be associated with HDD vibration threshold dataset for each of the three linear axes and each of the three rotational axes. For simplicity, HDD vibration threshold dataset for only a single axis is shown in FIG. 1D.

In one or more embodiments of the invention, HDD vibration threshold dataset (e.g., HDD vibration threshold dataset (142)) may refer to data that was measured and recorded from a constructed model (e.g., historical HDD vibration threshold data), data that was randomly generated within parameters (e.g., initial HDD vibration threshold data), or iteratively calculated HDD vibration threshold dataset (e.g., idealized HDD vibration threshold data). Further, in one or more embodiments of the invention, the HDD vibration threshold dataset (142) may be segmented into two or more frequencies ranges (for exemplary purposes, five ranges are shown in FIG. 1D). As an example, the HDD vibration threshold dataset (142) may have known and/or apparent linear thresholds across a specific frequency range and therefore may be represented as a series of line segments and/or an equivalent piecewise function.

In one or more embodiments of the invention, an enclosure vibration dataset (e.g., enclosure vibration dataset (144)) are a collection of measured and recorded data from one or more vibration sensors within a fully or partially constructed enclosure. Enclosure vibration dataset (144) includes one or more datapoints indicating the amplitude of vibration measured by the vibration sensor at a corresponding frequency. In one or more embodiments of the invention, the enclosure may have one or more sources of vibration (e.g., fans) that generate more vibrations at certain frequencies (as indicated by higher amplitudes at those frequencies). Further, in one embodiment of the invention, an enclosure may have natural frequencies at which vibration may be more concentrated (as indicated by higher amplitudes at those frequencies).

In one or more embodiments of the invention, the HDD vibration threshold dataset (142) may be compared to the enclosure vibration dataset (144) to determine if the enclosure vibration dataset (144) indicates vibrations beyond the acceptable bounds of the HDD vibration threshold dataset (142). Accordingly, in one or more embodiments of the invention, a violation (e.g., violation A (146.1), violation B (146.2), violation C (146.3), violation D (146.4)) is calculated result of a comparison between the HDD vibration threshold dataset (142) and the enclosure vibration dataset (144). Specifically, a violation (146.1, 146.2, 146.3, 146.4) is a region in which the enclosure vibration dataset (144) exceeds the HDD vibration threshold dataset (142).

In one or more embodiments of the invention, a violation (146.1, 146.2, 146.3, 146.4) may be quantified using one or more methods of mathematical analysis. For example, a violation may be measured by the difference in amplitude between the peak of the enclosure vibration dataset (144)

and the HDD vibration threshold dataset (142) at the corresponding frequency. As another example, the area (measured by integration) under the enclosure vibration dataset (144) may be summed over the range of frequencies the amplitude exceeds the HDD vibration threshold dataset (142). One of ordinary skill in the art, having the benefit of this detailed description, would appreciate that many methods of mathematical analysis may be applied to the comparison data to derive a quantitative value for a violation (146.1, 146.2, 146.3, 146.4).

In one or more embodiments of the invention, a violation (146.1, 146.2, 146.3, 146.4) is a higher quantitative value depending on the frequency range at which the violation occurs. As a non-limiting example, a violation that occurs between 250 Hz and 1,000 Hz (e.g., violation B (146.2)) may be assigned a multiplier of 1, whereas a violation that occurs between 4,000 Hz and 5,000 Hz (e.g., violation D (146.4)) may be assigned a multiplier of 4. Accordingly, after a raw quantitative value of the violations (146.2, 146.4) are calculated, each value may be multiplied by their respective multiplier. In one or more embodiments of the invention, the multiplier indicates a proportional increase in the degradation of HDD performance due to violations within those frequency ranges.

In one or more embodiments of the invention, a violation (146.1, 146.2, 146.3, 146.4) may not result in inoperability of the HDD; rather, a violation (146.1, 146.2, 146.3, 146.4) may indicate a potential degradation in HDD performance (e.g., slower IOPs). Alternatively, violations (146.1, 146.2, 146.3, 146.4) of a significant magnitude may cause inoperable and/or sufficiently undesirable HDD operation (e.g., inability to read/write data, high occurrence of retries due to failed reads/writes, etc.).

In one or more embodiments of the invention, an HDD performance dataset, for one HDD, is the collection of calculated violation values for the HDD vibration threshold dataset(s) for that HDD for a particular enclosure vibration dataset. As a non-limiting examples, HDD performance dataset may be (i) the summation of violation values for all frequency ranges and dimensional axes of an HDD, (ii) an array of violation values separately indicating the summation of violations values for each dimensional axis, and/or (iii) a matrix of violation values separately indicating each frequency range and dimensional axis.

While FIG. 1D shows a specific example of HDD vibration threshold dataset and enclosure vibration dataset, other configurations may be used without departing from the scope of the invention. Accordingly, embodiments disclosed herein should not be limited to the example shown in FIG. 1D.

Figure 2:
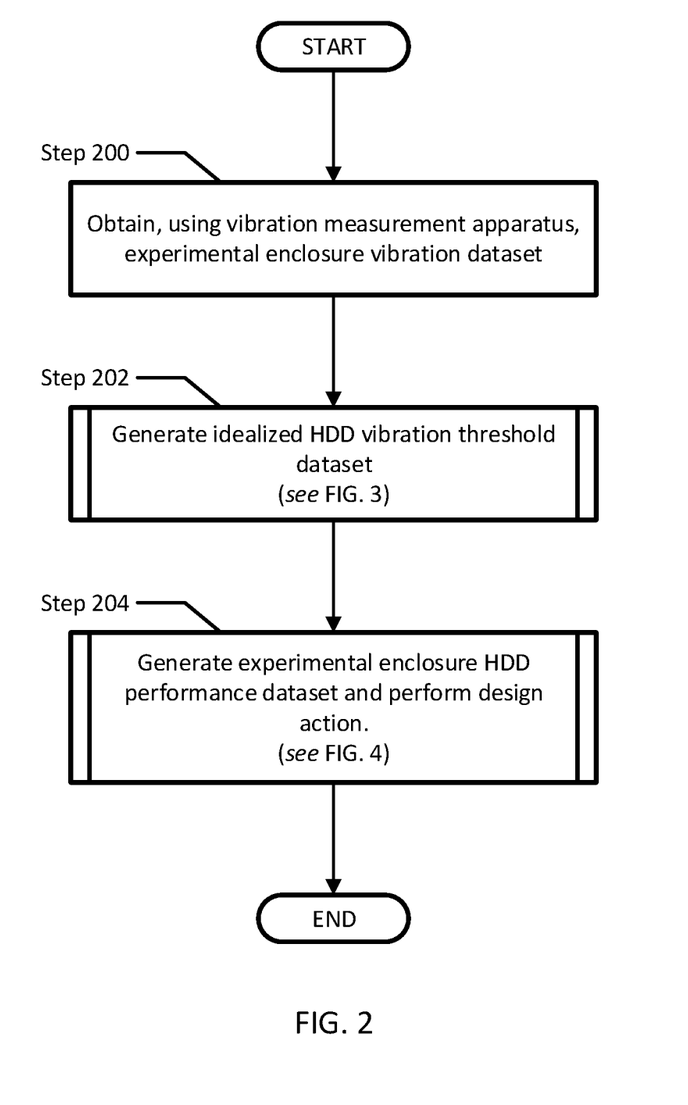
FIG. 2 shows a flowchart of an overall method of generating data for an experimental enclosure, in accordance with one or more embodiments of the invention.

FIG. 2 shows a flowchart of an overall method of generate data for an experimental enclosure, in accordance with one or more embodiments of the invention. All or a portion of the method shown in FIG. 2 may be performed by one or more components of the system and a user thereof. However, another component of the system may perform this method without departing from the invention. While the various steps in this flowchart are presented and described sequentially, one of ordinary skill in the relevant art will appreciate that some or all of the steps may be executed in different orders, may be combined or omitted, and some or all steps may be executed in parallel.

In Step 200, experimental enclosure vibration dataset is obtained using an experimental enclosure and a vibration measurement apparatus. In one or more embodiments of the invention, an experimental enclosure may only be partially constructed before vibration measurements are recorded in the vibration measurement apparatus. For example, an experimental enclosure may only include bare structural elements (e.g., folded sheet metal of the outer chassis) and primary sources of vibration (e.g., fans). Accordingly, other components that are normally included within an enclosure (e.g., a power supply, printed circuit boards, HDDs, internal structural compartments for other components) are not added to the experimental enclosure for obtaining experimental enclosure vibration dataset.

Alternatively, in one or more embodiments of the invention, a fully constructed enclosure may be used to gather enclosure vibration dataset (e.g., that includes all components that are normally included within the enclosure). However, in such embodiments, the enclosure vibration dataset is not considered "experimental".

In Step 202, idealized HDD vibration dataset is generated. In one or more embodiments of the invention, the analysis system may include a historical HDD vibration dataset repository that includes one or more HDD vibration datasets, measured during previous experiments and/or known from the HDD manufacturer, that are specific to individually tested HDDs. However, each HDD vibration dataset is too specific to the associated HDD from which the vibration threshold dataset was gathered, therefore idealized HDD vibration threshold dataset is obtained that is broadly representative of the HDD vibration threshold dataset for two or more HDDs. Details regarding the process of Step 202 are discussed in the description of FIG. 3.

In Step 204, experimental enclosure HDD performance dataset is generated for the experimental enclosure, and a design action is performed, if necessary. In one or more embodiments of the invention, the idealized HDD threshold dataset is used to obtain the experimental enclosure HDD performance dataset thereby making the experimental enclosure HDD performance dataset representative of the HDD data thresholds of two or more HDDs. Details regarding the process of Step 204 are discussed in the description of FIG. 5.

Figure 3:
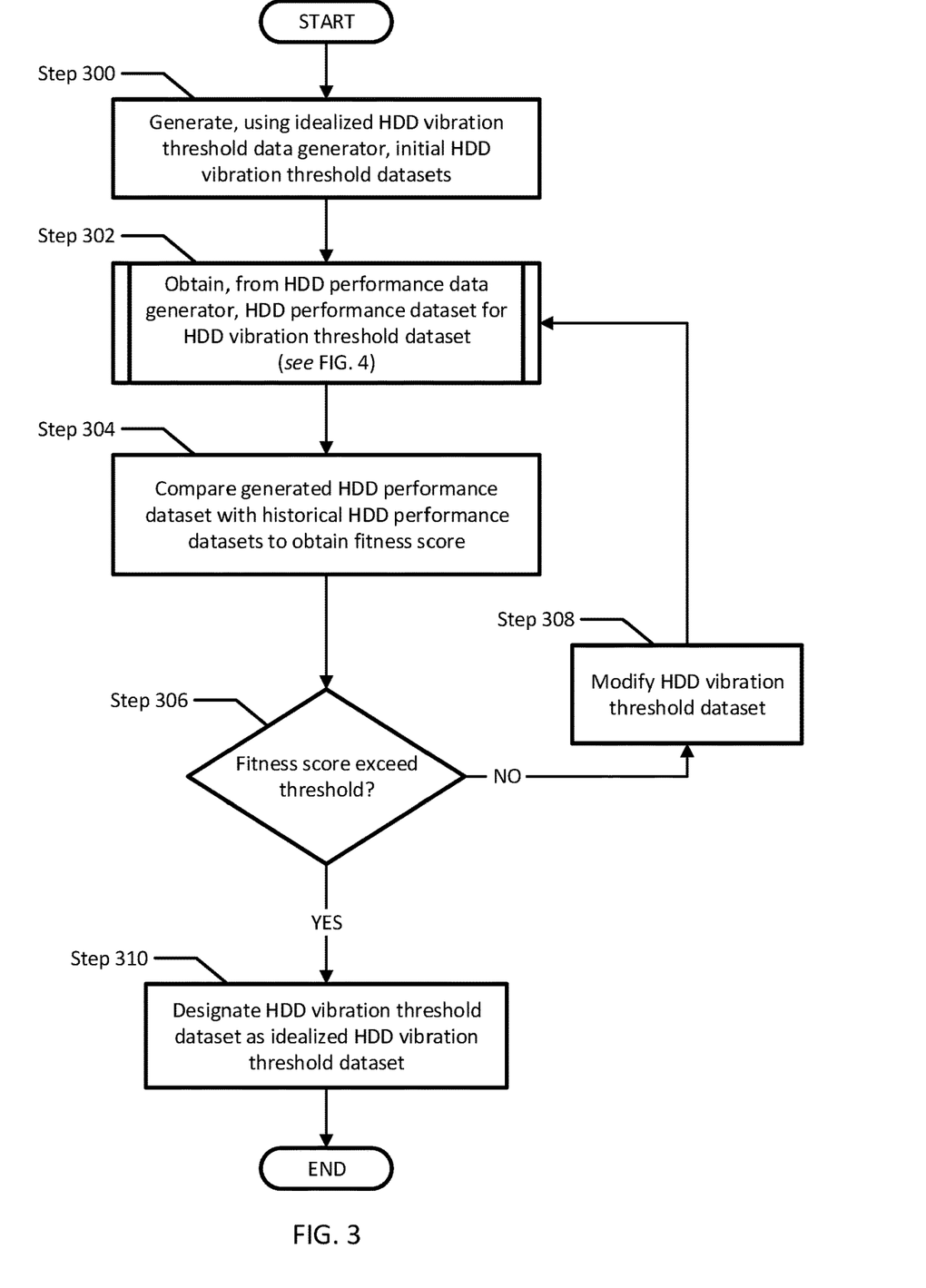
FIG. 3 shows a flowchart of a method of obtaining an idealized HDD vibration threshold dataset, in accordance with one or more embodiments of the invention.

FIG. 3 shows a flowchart of a method of obtaining idealized HDD vibration threshold dataset, in accordance with one or more embodiments of the invention. All or a portion of the method shown in FIG. 3 may be performed by one or more components of the idealized HDD data generator. However, another component of the system may perform this method without departing from the invention. While the various steps in this flowchart are presented and described sequentially, one of ordinary skill in the relevant art will appreciate that some or all of the steps may be executed in different orders, may be combined or omitted, and some or all steps may be executed in parallel.

In Step 300, the idealized HDD vibration threshold data generator generates initial HDD vibration threshold datasets. In one or more embodiments of the invention, each HDD vibration threshold dataset of the initial HDD vibration threshold datasets may be generated using random values within a preset range. That is, if HDD vibrations thresholds are generally known to exist within certain ranges, the initially generated values may be randomly selected from within that range. As a non-limiting example, as discussed in the description of FIG. 1D, an example threshold may be 0.1 PSD for the frequency range 0 Hz and 250 Hz; further it may be known that amplitudes in this frequency range generally range between 0.08 PSD and 0.12 PSD. Accordingly, randomly generated initial HDD vibration threshold dataset may be limited to the range of 0.08 PSD to 0.12 PSD for the 0 Hz and 250 Hz frequency range. One of ordinary skill in the art, having the benefit of this detailed description, would appreciate that randomly generated data may not be truly "random" and that additional constraints may be placed on the values generated.

In one or more embodiments of the invention, two or more distinct HDD vibration threshold datasets may be generated (collectively referred to as "initial HDD vibration threshold datasets") and stored in an HDD vibration threshold dataset repository. Accordingly, two or more HDD vibration threshold datasets may proceed through the process of FIG. 3 to allow for comparison at a later step.

In Step 302, the idealized HDD vibration threshold data generator obtains HDD performance dataset generated from the HDD performance dataset generator of the analysis system. In one or more embodiments of the invention, the idealized HDD vibration threshold data generator initiates the HDD performance dataset generator to generate HDD performance dataset with instructions to use the HDD vibration threshold dataset (initially generated in Step 300 or modified in Step 308) and historical enclosure vibration dataset from the historical enclosure vibration dataset repository. Details regarding the process of Step 302 are discussed in the description of FIG. 4.

In Step 304, the idealized HDD vibration threshold data generator compares the HDD performance dataset (generated in Step 302) against one or more entries in the historical HDD performance dataset repository to obtain a fitness score. In one or more embodiments of the invention, one or more data fitting methods may be utilized to provide a quantitative measurement of how well the generated HDD performance dataset aligns with previously calculated (e.g., "historical") HDD performance dataset in the historical HDD performance dataset repository.

As discussed in the description of FIG. 1D, the generated HDD performance dataset (obtained in Step 302) may include one or more violation values for each linear/rotational axis and/or specific violation values for frequencies ranges thereof in an array or matrix of data. Accordingly, as a non-limiting example, the generated HDD performance dataset (and the historical HDD performance datasets) may be an array of summed violation values for each axis.

Then, the vibration threshold data generator calculates and assigns a "fitness" score each HDD performance dataset (and corresponding HDD vibration threshold dataset initially generated in Step 300 or return from Step 308). In one or more embodiments of the invention, the fitness score is calculated using a method of regression analysis. As a non-limiting example, the method of "least squares" may be used to calculate relative similarity of the generated HDD performance dataset with the historical HDD performance datasets. As a non-limiting example, the difference between each value of the array of the generated HDD performance dataset and each value of the array of the one or more HDD performance dataset(s) may be calculated. Then, the total difference may be summed to calculate a single fitness score (where lower fitness score indicates higher similarity of the generated HDD performance dataset to the historical HDD performance dataset(s)).

In Step 306, the idealized HDD vibration threshold data generator determines if the fitness score of the HDD vibration threshold (generated at Step 300) exceeds a threshold. In one or more embodiments of the invention, a preset threshold may be input into the analysis system that causes the iterative modification (Step 302 and Step 304) of the HDD vibration threshold dataset to stop once the HDD vibration threshold dataset converges to an acceptable fitness score.

If the fitness score is determined to not exceed the threshold (306—NO), the method proceeds to Step 308. Alternatively, if the fitness score is determined to exceed the threshold (306—YES), the process proceeds to Step 310.

Alternatively, in one or more embodiments of the invention, the idealized HDD vibration threshold data generator may not determine if the fitness score exceeds a threshold. Instead, the idealized HDD vibration threshold data generator may allow Steps 302, 304, and 308 to repeat a fixed number of times. As a non-limiting example, the idealized HDD vibration threshold data generator may be configured to require that the HDD vibration threshold dataset iteratively repeat Steps 302, 304, and 308 one thousand times before selecting whichever generated HDD performance dataset is "most fit" and proceeding to Step 310.

In Step 308, the idealized HDD vibration threshold data generator updates the HDD vibration threshold dataset using a one or more algorithm(s).

In one or more embodiments of the invention, a "genetic" algorithm may be utilized that comparatively identifies the "most fit" HDD vibration threshold dataset (i.e., with the corresponding lowest fitness score indicating a generated HDD performance dataset most similar to historical HDD performance datasets). Then, that "most fit" HDD vibration threshold dataset may proceed back into Step 302 unaltered. However, additional HDD vibration threshold datasets may be generated that are similar to the "most fit" HDD vibration threshold dataset. As a non-limiting example, the idealized HDD vibration threshold data generator may generate a series of HDD vibration threshold datasets that have minor random variations of the "most fit" HDD vibration threshold dataset. Portions of the "most fit" HDD vibration threshold dataset may be spliced with portions of other "fit" HDD vibration threshold datasets (e.g., generating new HDD vibration threshold datasets using portions of the five "most fit" HDD vibration threshold datasets).

As another non-limiting example, the idealized HDD vibration threshold data generator may identify where fitness for the "most fit" HDD performance dataset was most lacking and generate one or more new HDD vibration threshold datasets modifying the most pertinent properties of the "most fit" HDD vibration threshold dataset.

As another non-limiting example, the idealized HDD vibration threshold data generator may allow a certain "most fit" percentile of HDD vibration threshold datasets to return unaltered to Step 302 while generating an additional random HDD vibration threshold dataset. One of ordinary skill in the art, having the benefit of this detailed description, would appreciate that any algorithm for modifying data may be utilized when converging data via regression analysis.

In Step 310, the idealized HDD vibration threshold data generator designates the "most fit" HDD vibration threshold dataset as the idealized HDD vibration threshold dataset.

Figure 4:
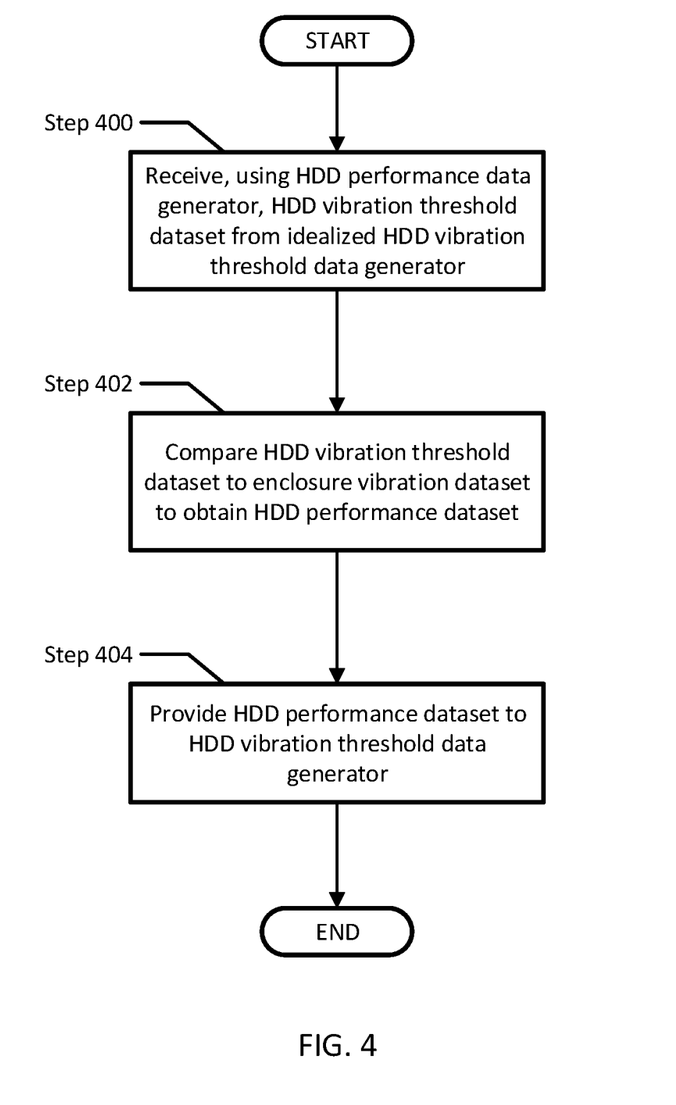
FIG. 4 shows a flowchart of a method of obtaining an HDD performance dataset, in accordance with one or more embodiments of the invention.

FIG. 4 shows a flowchart of a method of obtaining HDD performance dataset, in accordance with one or more embodiments of the invention. All or a portion of the method shown in FIG. 4 may be performed by one or more components of the HDD performance dataset generator. However, another component of the system may perform this method without departing from the invention. While the various steps in this flowchart are presented and described sequentially, one of ordinary skill in the relevant art will appreciate that some or all of the steps may be executed in different orders, may be combined or omitted, and some or all steps may be executed in parallel.

In Step 400, the HDD performance data generator obtains the HDD vibration threshold dataset and historical enclosure vibration dataset to perform a comparative analysis. n one or more embodiments of the invention, the HDD vibration threshold dataset and historical enclosure vibration dataset may be read from one or more storage device(s) of the analysis system. In one or more embodiments of the invention, the process of FIG. 4 may be initiated by the idealized HDD vibration threshold data generator when performing another process.

In Step 402, the HDD performance data generator compares vibration threshold dataset to one or more historical enclosure vibration dataset(s). As discussed in the description of FIG. 1D, the HDD performance data generator may identify one or more violations of a combined vibration threshold dataset and historical enclosure vibration dataset and calculate one or more violation values. To generate the generated HDD performance dataset, the HDD performance data generator may sum the violation values into a single value, partially sum the violation values (per axis) and organize the values into an array, or organize the violation values into a matrix.

In Step 404, the HDD performance data generator provides the generated HDD performance dataset to the idealized HDD vibration threshold data generator.

Figure 5:
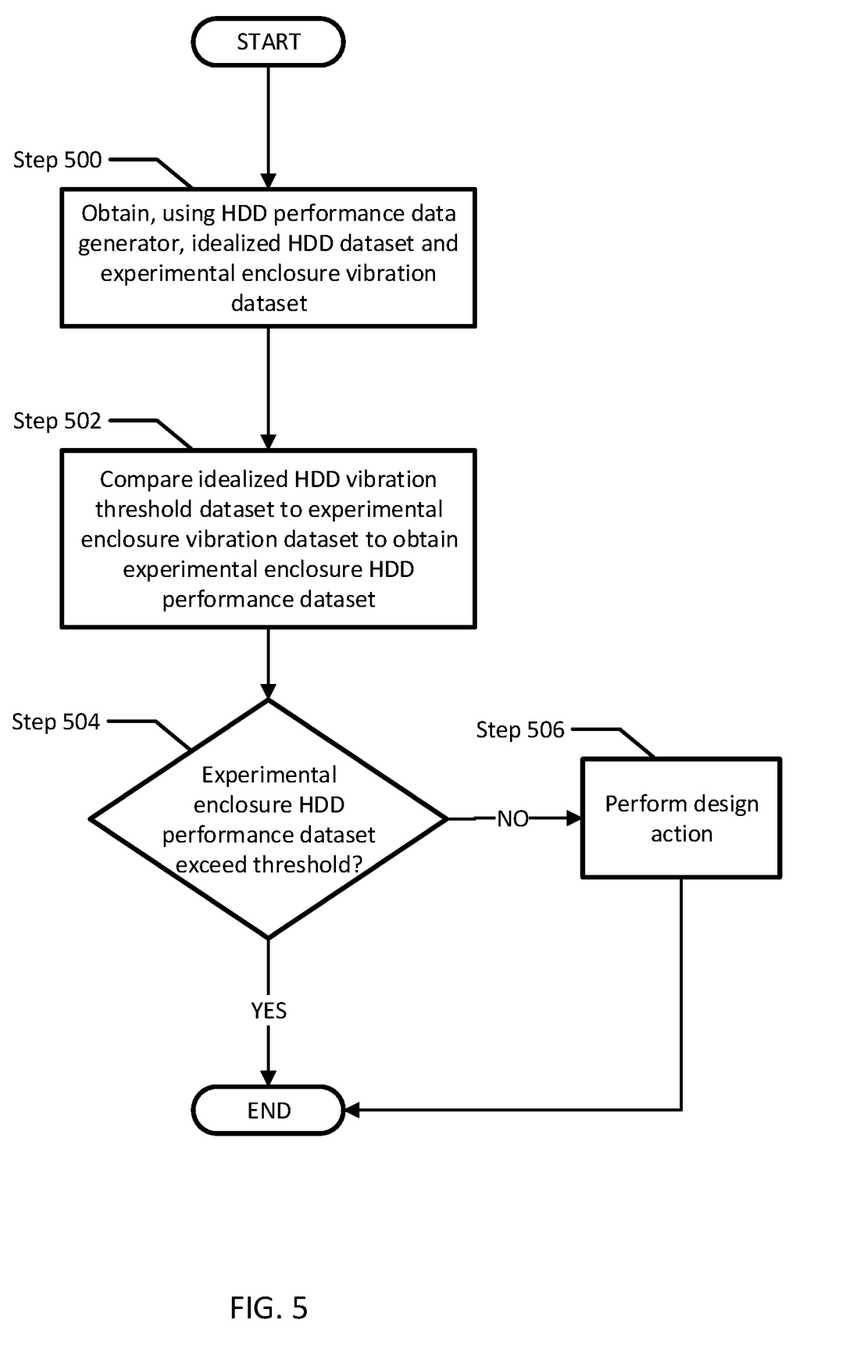
FIG. 5 shows a flowchart of a method of obtaining an HDD performance dataset for an experimental enclosure, in accordance with one or more embodiments of the invention.

FIG. 5 shows a flowchart of a method of obtaining HDD performance dataset for an experimental enclosure, in accordance with one or more embodiments of the invention. All or a portion of the method shown in FIG. 5 may be performed by one or more components of the HDD performance dataset generator and the analysis system generally. However, another component of the system may perform this method without departing from the invention. While the various steps in this flowchart are presented and described sequentially, one of ordinary skill in the relevant art will appreciate that some or all of the steps may be executed in different orders, may be combined or omitted, and some or all steps may be executed in parallel.

In Step 500, the HDD performance data generator obtains the idealized HDD vibration threshold dataset and experimental enclosure vibration dataset to perform a comparative analysis. In one or more embodiments of the invention, the idealized HDD vibration threshold dataset and experimental enclosure vibration dataset may be read from one or more storage device(s) of the analysis system. With the exception that the idealized HDD vibration threshold dataset and experimental enclosure vibration dataset are used as inputs, the process of Step 500 is similar to the process of Step 400 discussed in the description of FIG. 4.

In Step 502, the HDD performance data generator obtain an experimental enclosure HDD performance dataset by comparing the idealized HDD vibration threshold dataset and experimental enclosure vibration dataset. With the exception that the idealized HDD vibration threshold dataset and experimental enclosure vibration dataset are compared, the process of Step 502 is similar to the process of Step 402 discussed in the description of FIG. 4.

In Step 504, the analysis system determines if the experimental enclosure HDD performance dataset exceeds a performance threshold. In one or more embodiments of the invention, a preset threshold may be input into the analysis system that causes the analysis system to determine if the experimental enclosure will allow for suitable HDD operation. As a non-limiting example, if the experimental enclosure HDD performance dataset includes violation values indicating significant degradation in HDD IOPS performance, the performance threshold may be exceeded.

If the experimental enclosure HDD performance dataset exceeds the performance threshold (504—YES), the process may end. Alternatively, if the experimental enclosure HDD performance dataset does not exceed the performance threshold (504—NO), the process proceeds to Step 506.

In Step 506, a design action may have to be performed on the experimental enclosure. In one or more embodiments of the invention, if the experimental enclosure HDD performance dataset indicates that vibration of the HDDs will cause unacceptable IOPS errors, the design of the experimental enclosure may need to be modified to reduce the vibration potentially experienced by an HDD. For example, minor structural changes to the experimental enclosure may be employed that alter the natural frequency (thereby potentially reducing the amplitude of a certain frequency range). As another example, the location of the HDDs within the experimental enclosure may be moved to an area that experiences less vibration.

In one or more embodiments of the invention, a design action is based on the ideal HDD vibration threshold dataset. As a non-limiting example, the ideal HDD vibration threshold dataset provides ranges of vibration frequency at which HDDs are most sensitive. Accordingly, the experimental enclosure may be redesigned to reduce vibrations that resonate within those sensitive frequency ranges (e.g., frequencies with the lowest threshold amplitude in the ideal HDD vibration threshold dataset). As another non-limiting example, the ideal HDD vibration threshold dataset may provide a frequency range that has a comparatively higher threshold amplitude. Accordingly, the experimental enclosure may be redesigned to force existing sources of vibration into that higher threshold frequency range, thereby increasing the experimental enclosure HDD performance data.

Further, in one or more embodiments of the invention, an enclosure may be designed based on the results from the experimental enclosure HDD performance data. For example, if the experimental enclosure HDD performance data shows acceptable vibrations amplitudes throughout the entire frequency range, a complete enclosure may be fully constructed. As another non-limiting example, it may be determined that, based on the experimental enclosure HDD performance data, redesigns that reduce vibrations may be implemented during the construction of a fully assembled prototype enclosure.

While one or more embodiments have been described herein with respect to a limited number of embodiments and examples, one of ordinary skill in the art, having the benefit of this detailed description, would appreciate that other embodiments can be devised which do not depart from the scope of the embodiments disclosed herein. Accordingly, the scope should be limited only by the attached claims.

What is claimed is:

1. A method for predicting hard drive disk (HDD) performance in an experimental enclosure, comprising:
   obtaining, by an HDD performance data generator, an experimental enclosure vibration dataset from a vibration measurement apparatus;
   obtaining an ideal HDD vibration threshold dataset, wherein obtaining the ideal HDD vibration threshold dataset comprises:
      generating an HDD vibration threshold dataset,
      obtaining an HDD performance dataset using the experimental enclosure vibration dataset and the HDD vibration threshold dataset; and
      designating, based on a fitness score that specifies a similarity between the HDD performance dataset and historical HDD performance datasets, the HDD vibration threshold dataset as the ideal HDD vibration threshold dataset;

making a first comparison between the experimental enclosure vibration dataset and the ideal HDD vibration threshold dataset;

calculating, based on the first comparison, an experimental enclosure HDD performance dataset;

making a first determination that the experimental enclosure HDD performance dataset exceeds an acceptable threshold;

performing a design action on the experimental enclosure based on the first determination to generate a design of an enclosure, wherein the enclosure is a modified version of the experimental enclosure, and wherein the ideal HDD vibration threshold dataset is based on vibration threshold datasets from two or more HDDs stored in a historical HDD vibration dataset repository to determine the design action on the experimental enclosure relative to the enclosure.

2. The method of claim 1, wherein obtaining the experimental enclosure vibration dataset from the vibration measurement apparatus comprises:

recording vibration data from the experimental enclosure, wherein the experimental enclosure is partially constructed and wherein the enclosure is fully constructed.

3. The method of claim 2, wherein the vibration data is measured by a vibration sensor located near an HDD installation location.

4. The method of claim 1, wherein the experimental enclosure HDD performance dataset comprises a plurality of violation values.

5. The method of claim 4, wherein one of the violation values is greater than the acceptable threshold.

6. The method of claim 4, wherein a sum of the violation values is greater than the acceptable threshold.

7. The method of claim 1, wherein the design action comprises:

modifying the experimental enclosure to reduce vibrations.

8. A non-transitory computer readable medium comprising instructions which, when executed by a computer processor, enables the computer processor to perform a method for predicting hard drive disk (HDD) performance in an experimental enclosure, comprising:

obtaining, by an HDD performance data generator, an experimental enclosure vibration dataset from a vibration measurement apparatus;

obtaining an ideal HDD vibration threshold dataset, wherein obtaining the ideal HDD vibration threshold dataset comprises:

generating an HDD vibration threshold dataset, obtaining an HDD performance dataset using the experimental enclosure vibration dataset and the HDD vibration threshold dataset; and designating, based on a fitness score that specifies a similarity between the HDD performance dataset and historical HDD performance datasets, the HDD vibration threshold dataset as the ideal HDD vibration threshold dataset;

making a first comparison between the experimental enclosure vibration dataset and the ideal HDD vibration threshold dataset;

calculating, based on the first comparison, an experimental enclosure HDD performance dataset;

making a first determination that the experimental enclosure HDD performance dataset exceeds an acceptable threshold;

performing a design action on the experimental enclosure based on the first determination to generate a design of an enclosure, wherein the enclosure is a modified version of the experimental enclosure, and wherein the ideal HDD vibration threshold dataset is based on vibration threshold datasets from two or more HDDs stored in a historical HDD vibration dataset repository to determine the design action on the experimental enclosure relative to the enclosure.

9. The non-transitory computer readable medium of claim 8, wherein obtaining the experimental enclosure vibration dataset from the vibration measurement apparatus comprises:

recording vibration data from the experimental enclosure, wherein the experimental enclosure is partially constructed and wherein the enclosure is fully constructed.

10. The non-transitory computer readable medium of claim 9, wherein the vibration data is measured by a vibration sensor located near an HDD installation location.

11. The non-transitory computer readable medium of claim 8, wherein the experimental enclosure HDD performance dataset comprises a plurality of violation values.

12. The non-transitory computer readable medium of claim 11, wherein one of the violation values is greater than the acceptable threshold.

13. The non-transitory computer readable medium of claim 11, wherein a sum of the violation values is greater than the acceptable threshold.

14. The non-transitory computer readable medium of claim 8, wherein the design action comprises:

modifying the experimental enclosure to reduce vibrations.

15. An analysis system, comprising:

a processor;

memory comprising instructions, which when executed by the processor, cause the processor to perform a method, the method comprising:

obtaining an experimental enclosure vibration dataset from a vibration measurement apparatus;

obtaining an ideal HDD vibration threshold dataset, wherein obtaining the ideal HDD vibration threshold dataset comprises:

generating an HDD vibration threshold dataset, obtaining an HDD performance dataset using the experimental enclosure vibration dataset and the HDD vibration threshold dataset; and designating, based on a fitness score that specifies a similarity between the HDD performance dataset and historical HDD performance datasets, the HDD vibration threshold dataset as the ideal HDD vibration threshold dataset;

making a first comparison between the experimental enclosure vibration dataset and the ideal HDD vibration threshold dataset;

calculating, based on the first comparison, an experimental enclosure HDD performance dataset;

making a first determination that the experimental enclosure HDD performance dataset exceeds an acceptable threshold;

performing a design action on the experimental enclosure based on the first determination to generate a design of an enclosure, wherein the enclosure is a modified version of the experimental enclosure, and wherein the ideal HDD vibration threshold dataset is based on vibration threshold datasets from two or more HDDs stored in a historical HDD vibration dataset repository to determine the design action on the experimental enclosure relative to the enclosure.

16. The analysis system of claim 15, wherein obtaining the experimental enclosure vibration dataset from the vibration measurement apparatus comprises:

recording vibration data from the experimental enclosure, wherein the experimental enclosure is partially constructed and wherein the enclosure is fully constructed.

17. The analysis system of claim 16, wherein the vibration data is measured by a vibration sensor located near an HDD installation location.

18. The analysis system of claim 15, wherein the experimental enclosure HDD performance dataset comprises a plurality of violation values.

19. The analysis system of claim 18, wherein one of the violation values is greater than the acceptable threshold.

20. The analysis system of claim 18, wherein a sum of the violation values is greater than the acceptable threshold.

* * * * *